(12) United States Patent
Yan

(10) Patent No.: US 11,984,347 B2
(45) Date of Patent: May 14, 2024

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Xun Yan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 334 days.

(21) Appl. No.: 17/530,561

(22) Filed: Nov. 19, 2021

(65) Prior Publication Data

US 2022/0076989 A1 Mar. 10, 2022

Related U.S. Application Data

(63) Continuation of application No. PCT/CN2021/101436, filed on Jun. 22, 2021.

(30) Foreign Application Priority Data

Aug. 18, 2020 (CN) .......................... 202010829677.1

(51) Int. Cl.
*H01L 21/762* (2006.01)
*H01L 21/308* (2006.01)
*H01L 21/311* (2006.01)
*H01L 21/768* (2006.01)

(52) U.S. Cl.
CPC .... *H01L 21/76224* (2013.01); *H01L 21/3086* (2013.01); *H01L 21/31144* (2013.01); *H01L 21/76811* (2013.01); *H01L 21/76877* (2013.01)

(58) Field of Classification Search
CPC ......... H01L 21/76224; H01L 21/76877; H01L 21/31144; H01L 21/76811; H01L 21/76808
See application file for complete search history.

(56) References Cited

U.S. PATENT DOCUMENTS

| | | | |
|---|---|---|---|
| 6,211,068 B1 * | 4/2001 | Huang | H01L 21/76808 438/622 |
| 6,323,121 B1 * | 11/2001 | Liu | H01L 21/31144 430/329 |
| 6,461,955 B1 * | 10/2002 | Tsu | H01L 21/76808 438/738 |

(Continued)

FOREIGN PATENT DOCUMENTS

| CN | 1753162 A | 3/2006 |
|---|---|---|
| CN | 100539074 C | 9/2009 |

(Continued)

*Primary Examiner* — Bac H Au
(74) *Attorney, Agent, or Firm* — Cooper Legal Group, LLC

(57) ABSTRACT

A semiconductor structure and a method for forming the same are provided. The method for forming a semiconductor structure includes the following operations. A substrate is provided. A dielectric layer having a first trench is formed on the substrate. A first filling layer is formed for partially filling the first trench. A first mask layer having a first opening is formed on the dielectric layer. The first opening exposes the first filling layer and part of the dielectric layer. The dielectric is etched by taking the first mask layer as a mask to form a second trench. The first filling layer is removed. And, conductive materials are formed in the first trench and the second trench.

12 Claims, 14 Drawing Sheets

(56) References Cited

U.S. PATENT DOCUMENTS

| | | | |
|---|---|---|---|
| 6,548,401 B1* | 4/2003 | Trivedi | H01L 21/76808 |
| | | | 438/700 |
| 7,538,025 B2 | 5/2009 | Chen | |
| 7,550,389 B1* | 6/2009 | Yoo | H01L 21/76808 |
| | | | 438/700 |
| 8,158,520 B2 | 4/2012 | Ning | |
| 9,202,744 B1* | 12/2015 | Ban | H01L 23/5226 |
| 2003/0054629 A1 | 3/2003 | Kawai | |
| 2003/0170978 A1* | 9/2003 | Lee | H01L 21/76811 |
| | | | 257/E21.257 |
| 2004/0018721 A1* | 1/2004 | Kim | H01L 21/76808 |
| | | | 257/E21.579 |
| 2004/0166669 A1* | 8/2004 | Saito | H01L 21/76808 |
| | | | 438/638 |
| 2005/0106856 A1 | 5/2005 | Chen | |
| 2006/0060971 A1 | 3/2006 | Ning | |
| 2011/0241214 A1* | 10/2011 | Feng | H01L 24/92 |
| | | | 257/E21.585 |
| 2012/0115303 A1* | 5/2012 | Gambino | H01L 21/76802 |
| | | | 438/399 |
| 2016/0099174 A1* | 4/2016 | Wu | H01L 21/76811 |
| | | | 438/618 |
| 2016/0163636 A1* | 6/2016 | Zhang | H01L 21/76808 |
| | | | 438/643 |
| 2019/0067089 A1* | 2/2019 | Yang | H01L 23/5226 |
| 2020/0035908 A1* | 1/2020 | Ku | H01L 21/76802 |
| 2020/0365451 A1* | 11/2020 | Tien | H01L 21/76811 |

FOREIGN PATENT DOCUMENTS

| | | |
|---|---|---|
| CN | 102376597 A | 3/2012 |
| CN | 109564875 A | 4/2019 |
| JP | 2002093901 A | 3/2002 |

* cited by examiner

SEMICONDUCTOR STRUCTURE AND METHOD FOR FORMING SAME

CROSS-REFERENCE TO RELATED APPLICATION

The present application is a U.S. continuation application of International Application No. PCT/CN2021/101436, filed on Jun. 22, 2021, which claims priority to China Patent Application No. 202010829677.1, filed on Aug. 18, 2020. International Application No. PCT/CN2021/101436 and China Patent Application No. 202010829677.1 are incorporated herein by reference in their entireties.

TECHNICAL FIELD

The present disclosure relates to the technical field of semiconductors, and particularly relates to a semiconductor structure and a method for forming the same.

BACKGROUND

With the continuous development of semiconductor integrated circuit technologies, a dimension of a conductive interconnection line and a distance between the conductive interconnection lines in an integrated circuit are continually reduced, resulting in a corresponding increase in an arrangement density of the conductive interconnection lines. As the arrangement density of the conductive interconnection lines increases, it is prone to cause a short-circuit phenomenon between the conductive interconnection lines, thereby causing performance of the semiconductor device to decrease or even fail.

SUMMARY

According to some embodiments, one aspect of the present disclosure provides a method for forming a semiconductor structure. The method includes the following operations.

A substrate is provided.

A dielectric layer having a first trench is formed on the substrate.

A first filling layer is formed for partially filling the first trench.

A first mask layer having a first opening is formed on the dielectric layer, and the first opening exposes the first filling layer and part of the dielectric layer.

The dielectric layer is etched by taking the first mask layer as a mask to form a second trench.

The first filling layer is removed.

And, conductive materials are formed in the first trench and the second trench.

According to some embodiments, another aspect of the present disclosure provides a semiconductor structure which is formed by the above-mentioned method for forming a semiconductor structure.

BRIEF DESCRIPTION OF THE DRAWINGS

In order to describe the technical solutions in the embodiments of the present application or in the existing related art more clearly, drawings required to be used in the embodiments or the illustration of the traditional technology will be briefly introduced below. Apparently, the drawings in the illustration below are only some embodiments of the present disclosure. Those ordinarily skilled in the art also can acquire other drawings according to the provided drawings without creative work.

DETAILED DESCRIPTION

Figure 1:
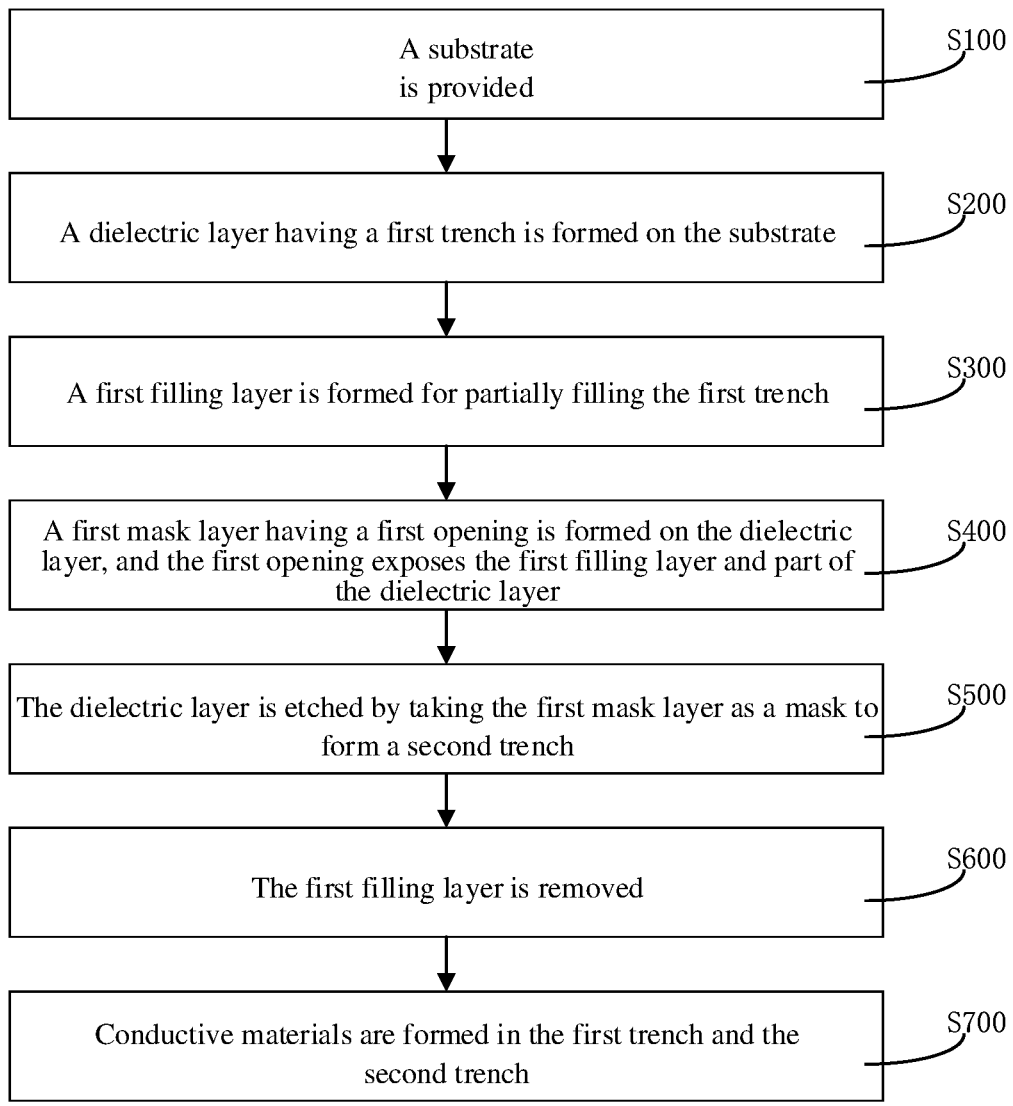
FIG. 1 illustrates a flowchart of a method for forming a semiconductor structure according to one embodiment.

For convenience of an understanding of the present disclosure, the present disclosure will now be described more fully below with reference to the related drawings. It should be noted that the present disclosure can be implemented in many different forms and is not limited to the embodiments described herein. These embodiments are provided so that the disclosed content of the present disclosure will be more thorough and complete.

Unless defined otherwise, all technical and scientific terms used herein have the same meaning as commonly understood by those skilled in the art to which the present disclosure belongs. The terms used herein in the specification of the present disclosure are for the purpose of describing specific embodiments only and are not intended to be limiting of the present disclosure. The term "and/or" used herein includes any and all combinations of one or more related listed items.

In the description of the present disclosure, it should be noted that orientations or positional relationships indicated by the terms "upper", "lower", "vertical", "horizontal", "inside", "outside" and the like are orientations or positional relationships as shown in the drawings, and are only for the purpose of facilitating and simplifying the description of the present disclosure, instead of indicating or implying that devices or elements indicated must have particular orientations, and be constructed and operated in the particular orientations, so that these terms are not construed as limiting the present disclosure.

FIG. 1 illustrates a flowchart of a method for forming a semiconductor structure according to one embodiment.

Referring to FIG. 1, in the present embodiment, the method for forming the semiconductor structure includes S100 to S700.

At S100, a substrate 100 is provided.

Figure 2:
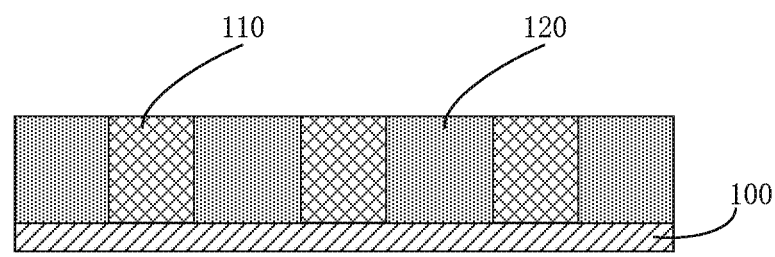
FIG. 2 schematically illustrates a cross section of a substrate 100 provided by one embodiment.

FIG. 2 schematically illustrates a cross-section of a substrate 100 provided by one embodiment. Referring to FIG. 2, in the present embodiment, a first conductive layer 110 and a first dielectric layer 120 have been formed in the substrate 100. Exemplarily, the first conductive layer 110 may be, but is not limited to, a structure such as a conductive interconnection line. Exemplarily, when the first conductive layer 110 is a conductive interconnection line, the first conductive layer 110 may transmit an electric signal to a semiconductor device, such as a transistor, in the substrate 100. The first dielectric layer 120 is used to isolate adjacent first conductive layers 110, so as to avoid a short-circuit phenomenon or a leak current phenomenon and other phenomena between the first conductive layers 110, thereby improving electrical reliability of the device. The first conductive layer 110 and the first dielectric layer 120 may be obtained by forming trenches in the substrate 100 and filling the trenches, or may be obtained by directly performing deposition on a surface of the substrate 100. The present embodiment does not specifically limit methods for forming the first conductive layer 110 and the first dielectric layer 120.

At S200, a dielectric layer 200 having a first trench 210 is formed on the substrate 100.

Figure 3:
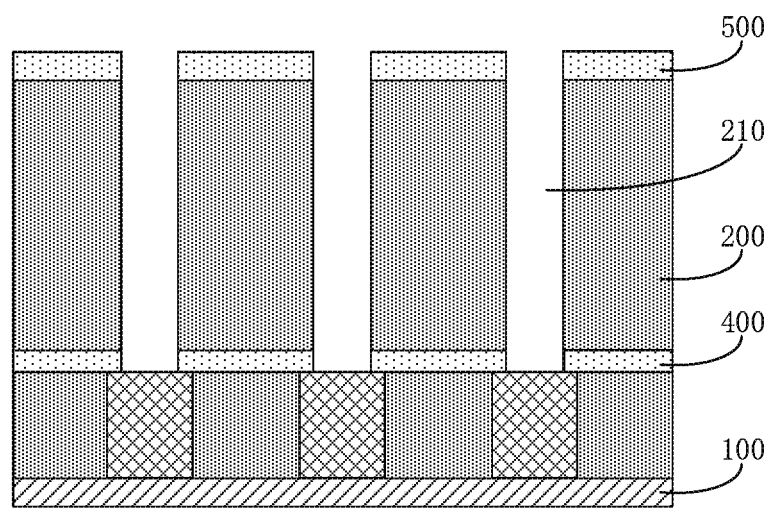
FIG. 3 schematically illustrates a cross section of a semiconductor structure after S200.

Specifically, FIG. 3 schematically illustrates a cross-section of a semiconductor structure after S200. Referring to FIG. 3, in the present embodiment, the first trench 210 exposes part of the first conductive layer 110 in a direction perpendicular to the substrate 100, so as to form a conductive material that is in contact with the first conductive layer 110 in the subsequent step, thereby realizing transmission of a signal in the first conductive layer 110. Exemplarily, the dielectric layer 200 may be first formed on a surface of the substrate 100, and is then etched to form the first trench 210. Or, a sacrificial layer with a position and size matched with the position and size of the first trench 210 may be first formed on the surface of the substrate 100. Then, the dielectric layer 200 is formed in a clearance of the sacrificial layer. Finally, the sacrificial layer is cleaned and removed to form the first trench 210.

Further, a thickness of the dielectric layer 200 is 100 nm to 1500 nm, such as 500 nm and 1000 nm. The specific thickness of the dielectric layer 200 is determined by a height of a second conductive layer 600 to be formed. The dielectric layer 200 may be formed by a technique such as a chemical vapor deposition (CVD) or a physical vapor deposition (PVD). A material of the dielectric layer 200 may be a low-K (dielectric constant) material, such as at least one of silicon dioxide ($SiO_2$), carbon silicon oxide (SiCO) or fluoride silica glass (FSG).

At S300, a first filling layer 211 partially filling the first trench 210 is formed.

Figure 4:
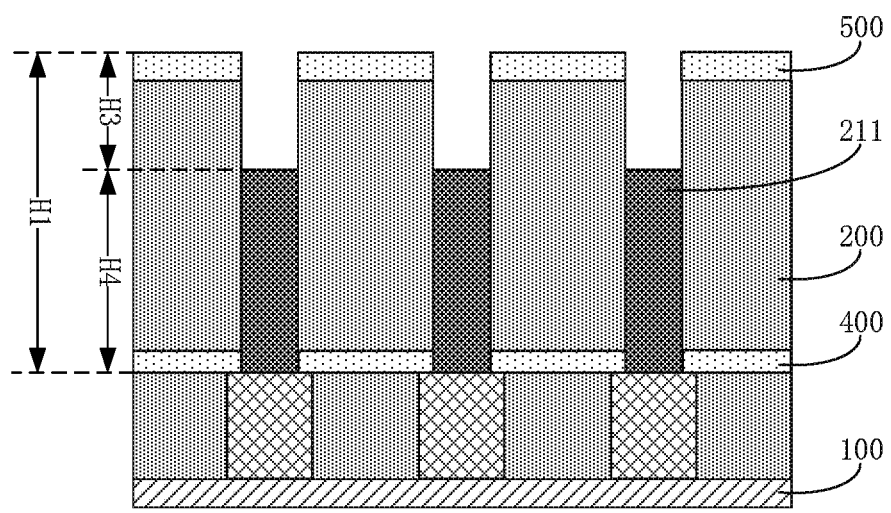
FIG. 4 schematically illustrates a cross section of a semiconductor structure after S300 of one embodiment.

FIG. 4 schematically illustrates a cross-section of a semiconductor structure after S300 of one embodiment. Referring to FIG. 4, in the present embodiment, a side wall of the first filling layer 211 is fitted to an inner wall of the first trench 210. That is, a projection of the first filling layer 211 on the substrate 100 completely covers the exposed substrate 100, or completely covers the exposed first conductive layer 110, and a top of the first filling layer 211 is lower than a top of the dielectric layer 200. It can be understood that in the subsequent step of etching to form other trench structures, if the first conductive layer 110 and the dielectric layer 200 are completely exposed to etching liquid or etching gas, the first conductive layer 110 and the dielectric layer 200 will be damaged. Therefore, in S300, the first filling layer 211 covers the exposed part of the first conductive layer 110 and part of a side wall of the first trench 210, so that in the subsequent etching step, the first conductive layer 110 in the substrate 100 can be prevented from being damaged, and the covered side wall of the dielectric layer 200 can also be prevented from being transversely etched, thereby improving the reliability of the semiconductor structure.

At S400, a first mask layer 300 having a first opening 310 is formed on the dielectric layer 200. The first opening 310 exposes the first filling layer 211 and part of the dielectric layer 200.

Figure 5:
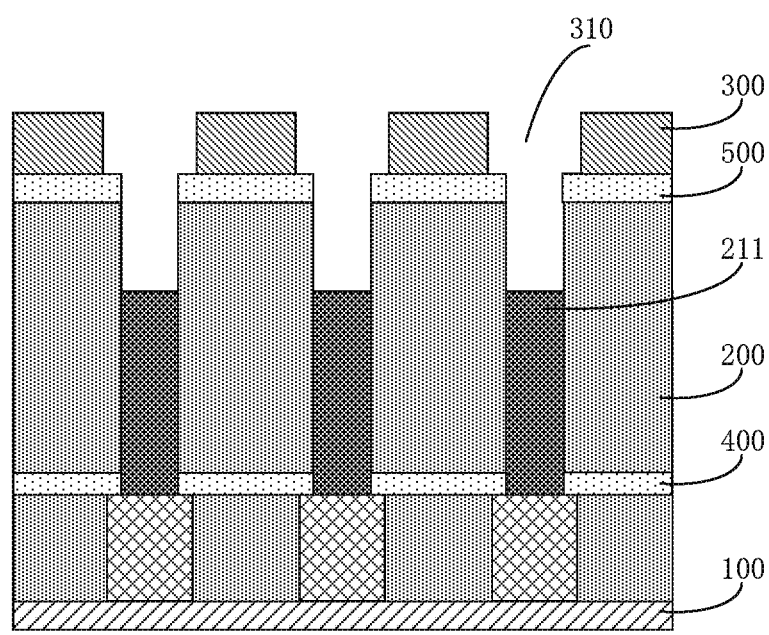
FIG. 5 schematically illustrates a cross section of a semiconductor structure after S400 of one embodiment.

Specifically, FIG. 5 schematically illustrates a cross-section of a semiconductor structure after S400 of one embodiment. Referring to FIG. 5, in the present embodiment, the first opening 310 on the first mask layer 300 exposes the first filling layer 211 and exposes part of the dielectric layer 200. The position and size of the first opening 310 correspond to the position and size of a second trench 220 to be formed, so that the second trench 220 is formed based on the first mask layer 300 in the subsequent step. The first mask layer 300 may be a photoresist layer or a hard mask layer, such as silicon nitride and silicon oxynitride. Specifically, a proper material of the first mask layer 300 may be selected according to an etching duration and an etchant.

At S500, the dielectric layer 200 is etched by taking the first mask layer 300 as a mask to form the second trench 220.

Figure 6:
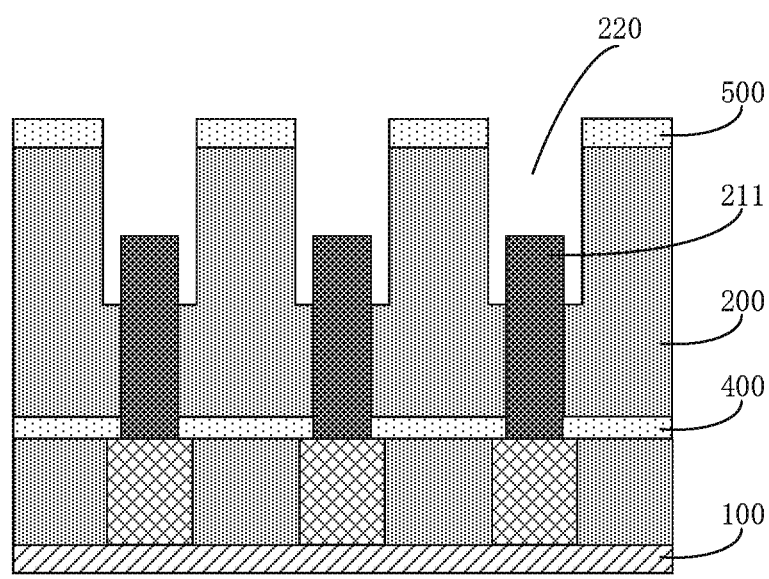
FIG. 6 schematically illustrates is a cross section of a semiconductor structure after S500 of one embodiment.
Figure 7:
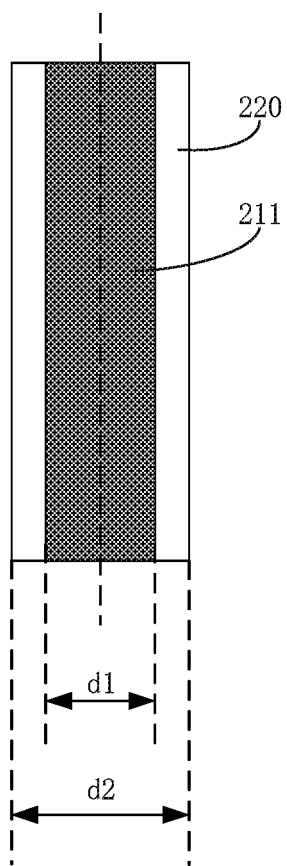
FIG. 7 schematically illustrates a top view of the semiconductor structure of the embodiment of FIG. 6.

FIG. 6 schematically illustrates a cross-section of a semiconductor structure after S500 of one embodiment, and FIG. 7 schematically illustrates a top view of the semiconductor structure of the embodiment of FIG. 6. In order to simplify the drawings, only one second trench 220 and the corresponding first filling layer 211 are illustrated in FIG. 7. Referring to FIG. 6 and FIG. 7, in the present embodiment, an extending direction of the first trench 210 and an extending direction of the first filling layer 211 are the same as an extending direction of the second trench 220, and an axis of symmetry of the first trench 210 parallel to the extending direction overlaps an axis of symmetry of the second trench 220 parallel to the extending direction, so as to ensure an etching effect of the second trench 220. Further, after S500, the method may further include the operations. The first mask layer 300 on a surface of the substrate 100 is removed.

In other embodiments, the first trench 210 or the first filling layer 211 in a direction parallel to the surface of the substrate 100 has a section in shape of circular or square. The first trench 210 is subsequently filled with a conductor to form a conductive plug. The second trench 220 in a direction parallel to the surface of the substrate 100 has a section in shape of linear. The second trench 220 is subsequently filled with a conductor to form a conductive wire.

A width of the second trench 220 is greater than a width of the first trench 210. The width of a trench means a size of the trench in a direction parallel to the substrate 100 and perpendicular to an axis of symmetry of the trench. Specifically, it can be understood that the width of the first filling layer 211 is the same as the width of the first trench 210. Referring to FIG. 7, the width of the first trench 210 is d1, and the width of the second trench 220 is d2. In S500, the width of the second trench 220 is set to be greater than the width of the first trench 210, so that a structure of a target second conductive layer 600 is formed in the subsequent step.

At S600, the first filling layer 211 is removed.

Figure 8:
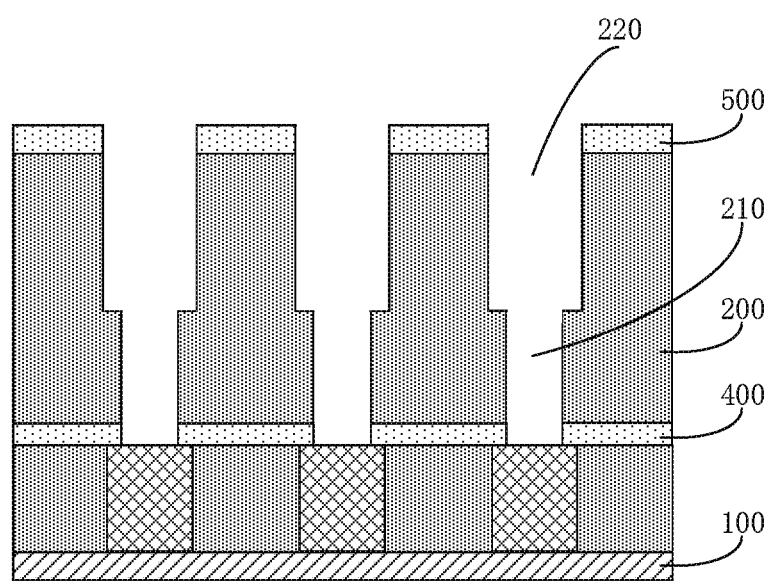
FIG. 8 schematically illustrates a cross section of a semiconductor structure after S700 of one embodiment.

FIG. 8 schematically illustrates a cross-section of a semiconductor structure after S700 of one embodiment. Referring to FIG. 8, in the present embodiment, the remaining first filling layer 211 in the first trench 210 and the second trench 220 is completely removed, so as to completely expose the side wall of the dielectric layer 200 and the top of the first conductive layer 110 to fill the first trench 210 and the second trench 220 with a conductive material in the subsequent step.

Further, the first filling layer 211 in the first trench 210 and the second trench 220 may be completely removed by wet etching. Furthermore, the first filling layer 211 and the dielectric layer 200 with a relatively large etch selection ratio are selected. For example, the etch selection ratio of the dielectric layer 200 to the first filling layer 211 may be greater than 7. For example, the etch selection ratio may be 8 to reduce damage to the dielectric layer 200 in the wet etching process, thereby avoiding that the remaining dielectric layer 200 is too thin and then preventing the second conductive layer 600 formed in the adjacent second trenches 220 from being short-circuited. That is, the reliability of the semiconductor structure is improved.

At S700, a conductive material is formed in the first trench 210 and the second trench 220.

Figure 9:
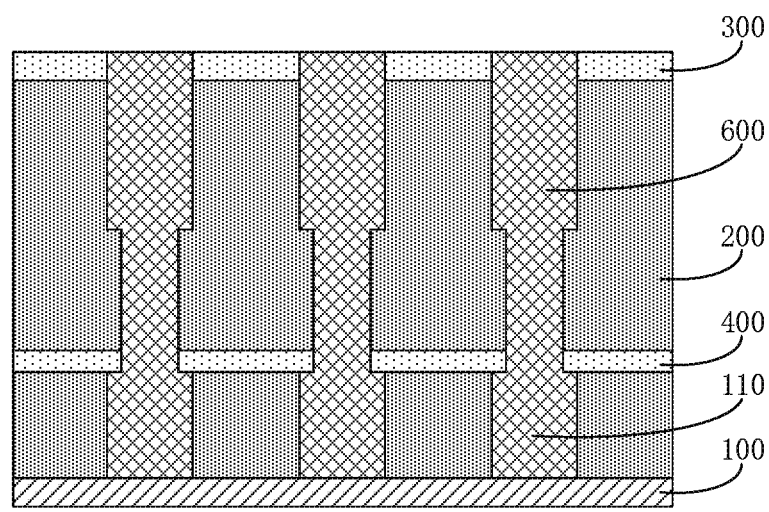
FIG. 9 schematically illustrates a cross section of a semiconductor structure after S800 of one embodiment.

FIG. 9 schematically illustrates a cross-section of a semiconductor structure after S800 of one embodiment. Referring to FIG. 9, in the present embodiment, the first trench 210 and the second trench 220 are completely filled with the conductive materials. The conductive materials in the first trench 210 and the second trench 220 jointly form the second conductive layer 600. That is, a bottom of the second conductive layer 600 is in contact with the top of the first conductive layer 110 in the substrate 100. A side wall of the second conductive layer 600 is fitted to the side wall of the dielectric layer 200. A top of the second conductive layer 600 upwards extends till it is flush with or higher than the top surface of the dielectric layer 200. Further, the conductive material may be a metal material, such as copper and aluminum.

In other embodiments, before the second conductive layer 600 is formed, a barrier layer is also formed on a surface of the side wall of the dielectric layer 200, such as titanium nitride and tantalum nitride to prevent the material of the second conductive layer 600 from diffusing into the dielectric layer 200.

In the present embodiment, the method for forming the semiconductor structure according to the embodiments of the present application includes the following operations. A substrate 100 is provided. A dielectric layer 200 having a first trench 210 is formed on the substrate 100. A first filling layer 211 partially filling the first trench 210 is formed. A first mask layer 300 having a first opening 310 is formed on the dielectric layer 200, the first opening 310 exposing the first filling layer 211, and part of the dielectric layer 200. The dielectric layer 200 is etched by taking the first mask layer 300 as a mask to form a second trench 220. The first filling layer 211 is removed. Conductive materials are formed in the first trench 210 and the second trench 220. In the present embodiment, by the method of first forming the first trench 210, partially filling the first trench 210 with the first filling layer 211, then forming the second trench 220 and removing the second trench, a height of the first filling layer 211 is matched with an arrangement density of the semiconductor structure, so that excessive transverse etching for the dielectric layer 200 by an etching process is avoided, which avoids a short-circuit phenomenon of the conductive materials and improves the electrical properties of the semiconductor structure. Furthermore, in the present embodiment, the second trench 220 which is wider than the first trench 210 is formed by an etching process, so that the first trench 210 and the second trench 220 are jointly used to deposit the conductive materials to form the semiconductor structure with better contact performance and structural reliability.

In one embodiment, before S200, the method further includes the operation that a first barrier layer 400 is formed on the substrate 100. Specifically, referring to FIG. 3, if the first barrier layer 400 is formed on the surface of the substrate 100, the dielectric layer 200 is formed on the first barrier layer 400. A material of the first barrier layer 400 is silicide, such as at least one of silicon nitride ($Si_3N_4$) or silicon oxynitride (SiON) or nitrogen-carbon silicon oxide (SiCNO). In the present embodiment, the first barrier layer 400 may prevent mutual diffusion between the first conductive layer 110 and the dielectric layer 200 to avoid reduction of the electric property of the semiconductor structure. Furthermore, the first barrier layer 400 may also protect the substrate 100, thereby preventing the first conductive layer 110 in the substrate 100 from being damaged in the subsequent etching process.

In one embodiment, continuing to refer to FIG. 3, step S200 further includes the following step. A second barrier layer 500 is formed on the dielectric layer 200. The second barrier layer 500 may protect the dielectric layer 200 in the subsequent etching process to prevent the top of the dielectric layer 200 from being damaged, thereby improving the performance of the semiconductor structure. A material of the second barrier layer 500 may be the same as or different from the material of the first barrier layer 400. The present embodiment does not specifically limit this. Further, the first barrier layer 400, the dielectric layer 200 and the second barrier layer 500 are formed on the surface of the substrate 100 in sequence, and the second barrier layer 500, the dielectric layer 200 and the first barrier layer 400 are etched in sequence by means of a one-step etching process to the surface of the substrate 100, thereby simplifying the technological process.

Figure 10:
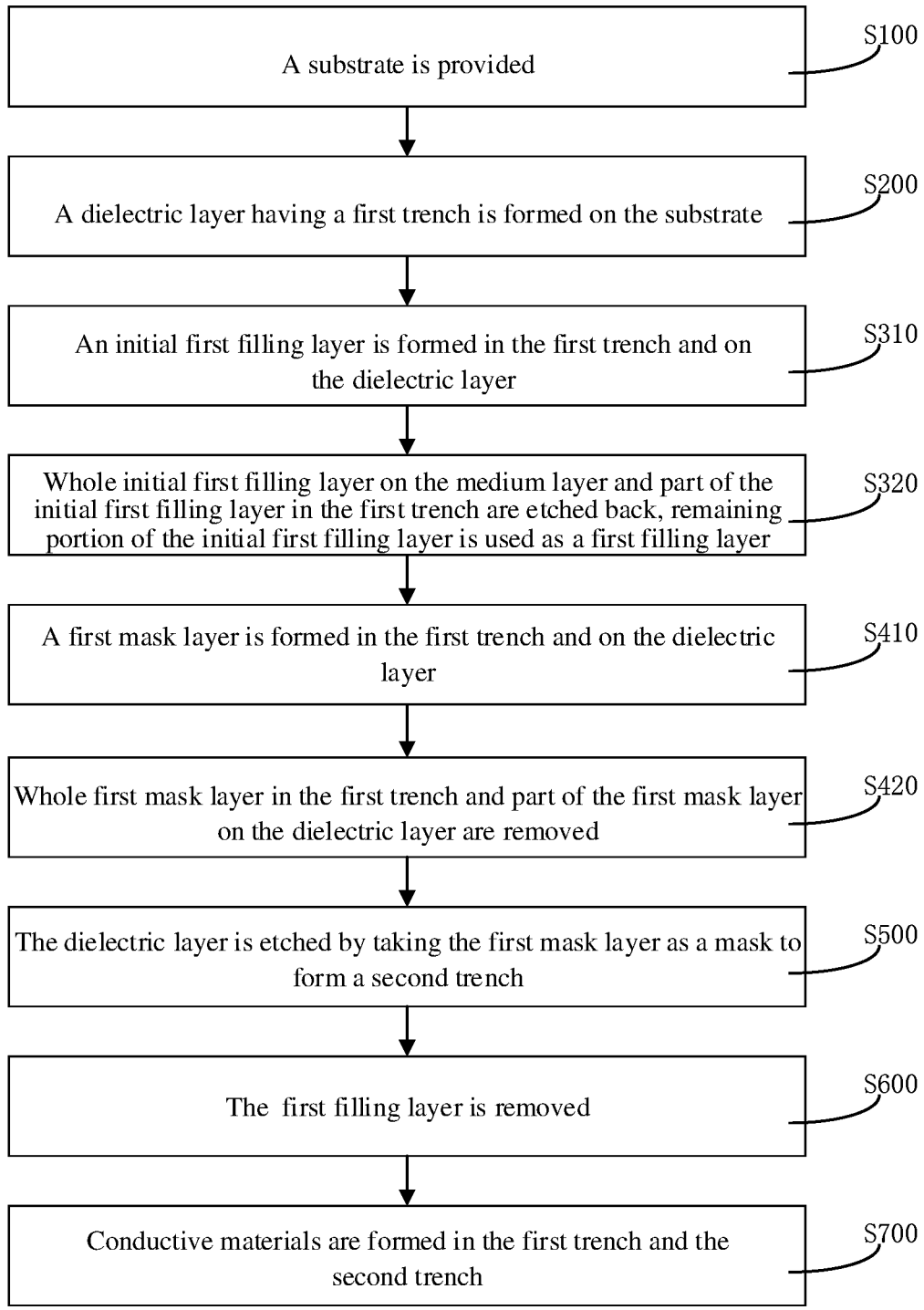
FIG. 10 illustrates a flowchart of a method for forming a semiconductor structure according to another embodiment.

FIG. 10 shows a flowchart of a method for forming a semiconductor structure according to one embodiment. Referring to FIG. 10, in the present embodiment, step S300 includes the steps S310 to S320.

At S310, an initial first filling layer 212 is formed in the first trench 210 and on the dielectric layer 200.

Figure 11:
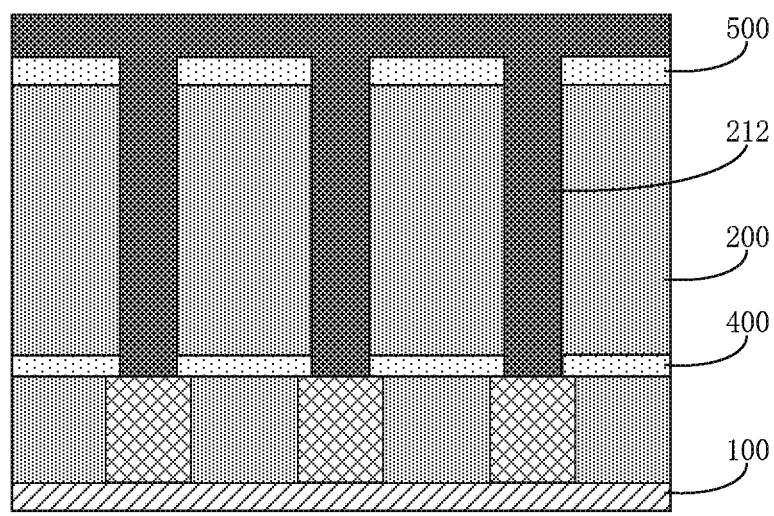
FIG. 11 schematically illustrates a cross section of a semiconductor structure after S310 of another embodiment.

FIG. 11 schematically illustrates a cross-section of a semiconductor structure after step S310 of another embodiment. Referring to FIG. 11, in the present embodiment, a top of the initial first filling layer 212 is higher than the second barrier layer 500. Further, the initial first filling layer 212 is formed by using a chemical vapor deposition or physical vapor deposition method. After the initial first filling layer 212 is formed, the top of the initial first filling layer 212 is treated by chemical mechanical planarization (CMP), so as to etch back a target depth more accurately in the subsequent operations, thereby improving the process yield of the semiconductor structure.

At S320, the whole initial first filling layer 212 on the dielectric layer 200 and part of the initial first filling layer 212 in the first trench 210 are etched back. The remaining initial first filling layer 212 is used as the first filling layer 211. It can be understood that if the first barrier layer 400, the dielectric layer 200, and the second barrier layer 500 has an overall height of H1, and the initial first filling layer 212 on the surface of the second barrier layer 500 has a height of H2, and a back-etching depth has a height of H3. That is, the first filling layer 211 with a target height H4 may be formed in the first trench 210, H4=H1+H2−H3. The height and the depth are both sizes in a direction perpendicular to the substrate 100. In the present embodiment, the semiconductor structure as shown in the figure may be formed by means of back etching of S320.

In one embodiment, S320 that the whole initial first filling layer 212 on the dielectric layer 200 and part of the initial first filling layer 212 in the first trench 210 are etched back, and the remaining initial first filling layer 212 is used as the first filling layer 211 includes the following operations. The whole initial first filling layer 212 on the dielectric layer 200 and part of the initial first filling layer 212 in the first trench 210 are etched back so that a height ratio of the first filling layer 211 satisfies a preset range, and the remaining initial first filling layer 212 is used as the first filling layer 211. The height ratio is a ratio of the height of the first filling layer 211 in the direction perpendicular to the substrate 100 to the depth of the first trench 210.

Specifically, continuing to refer to FIG. 4, in the embodiment shown in FIG. 4, the first filling layer 211 in the direction perpendicular to the substrate 100 has a height of H4, and the first trench 210 has a depth of H1. The height ratio is H4/H1. It can be understood that if the height ratio is too large, the height of the first filling layer 211 is excessive, the etchant cannot accurately reach the bottom of the first filling layer 211 in the subsequent operation of removing the first filling layer 211, which causes that the first filling layer 211 cannot be overall effectively stripped, ending up with reduction of a contact area between the second conductive layer 600 and the first conductive layer 110, increase in contact resistance, and decrease in the electric property of the semiconductor structure. If the height ratio is too small, it takes relatively long time to form the first filling layer 211 with the back-etching method, which easily causes damage to the top of the dielectric layer 200 and thus leads to a short circuit between adjacent second conductive layers 600. Therefore, a proper height ratio needs to be selected to obtain good device performance.

In one embodiment, the height ratio of the first filling layer 211 is between 0.7 and 0.9. For example, the height ratio of the first filling layer 211 may be 0.8. That is, the ratio of the height of the first filling layer 211 in the direction perpendicular to the substrate 100 to the depth of the first trench 210 is 0.8. Using the height ratio range of the present embodiment, a relatively good removing effect on the first filling layer 211 may be achieved in step S600 on the premise of less damage to the top of the dielectric layer 200.

In one embodiment, S400 includes S410 to S420.

At S410, a first mask layer 300 is formed in the first trench 210 and on the dielectric layer 200.

Figure 12:
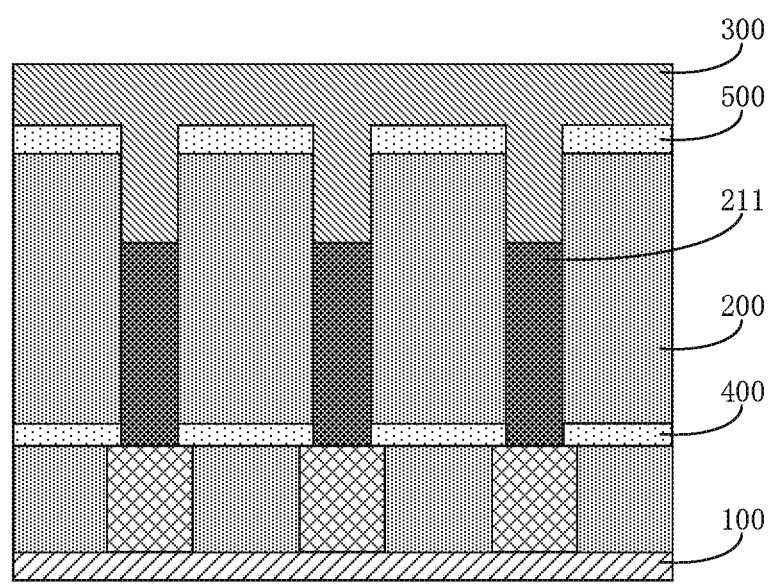
FIG. 12 schematically illustrates a cross section of a semiconductor structure after S410 of another embodiment.

FIG. 12 schematically illustrates a cross-section of a semiconductor structure after S410 of one embodiment. Referring to FIG. 12, the first mask layer 300 covers the top surface of the first filling layer 211 and completely fills the first trench 210, and a top surface of the first mask layer 300 is higher than that of the second barrier layer 500. In one embodiment, the first mask layer 300 is a photoresist layer. A method for patterning the photoresist layer is relatively simple. Furthermore, in the present embodiment, there a few of operation of etching by taking the first mask layer 300 as a mask. That is, the first mask layer 300 using the photoresist layer may bear an etching process without damaging the semiconductor structure.

At S420, the whole first mask layer 300 in the first trench 210 and part of the first mask layer 300 on the dielectric layer 200 are removed.

Specifically, the first mask layer 300 being the photoresist layer is taken as an example. The first mask layer 300 may be exposed through a photomask. A pattern of the photomask is the same as a projection of the second trench 220 to be formed on the substrate 100. After the exposure, the photoresist layer is developed, so as to remove the whole first mask layer 300 in the first trench 210 and part of the first mask layer on the dielectric layer 200 to form the device structure as shown in FIG. 5.

In one embodiment, S500 that the dielectric layer 200 is etched by taking the first mask layer 300 as a mask to form the second trench 220 includes the following operations. The dielectric layer 200 is etched by taking the first mask layer 300 as a mask to form the second trench 220. A depth of the second trench 220 is less than the depth of the first trench 210, and a bottom of the second trench 220 is lower than the top of the first filling layer 211. When the bottom of the second trench 220 is lower than the top of the first filling layer 211, in the process of forming the second trench 220, the height of the first filling layer 211 may play a role of adjusting an etching rate of the second trench 220. Specifically, the first filling layer 211 occupies an opening space of the first trench 210, so that the number of etching ions entering the first trench 210 is decreased, which reduces a transverse etching rate of the second trench 220, reduces the size of the second trench 220 in the surface direction of the substrate and prevents connection between adjacent second trenches 220.

In one embodiment, a ratio of the depth of the second trench 220 to the depth of the first trench 210 is between 0.5 and 0.8. That is, the ratio of the depth of the second trench 220 to the depth of the first trench 210 may be such as 0.5, 0.7. When the second barrier layer 500 is formed, the depth of the first trench 210 refers to a perpendicular distance between the top of the second barrier layer 500 and the surface of the substrate 100, and the depth of the second trench 220 refers to a perpendicular distance between the top of the second barrier layer 500 and the bottom of the second trench 220. Referring to FIG. 8, it can be understood that the width of second trench 220 is greater than the width of the first trench 210, so that an area when the conductive material is in contact with a region of the dielectric layer 200 corresponding to the second trench 220 is greater than an area when the conductive material is in contact with a region of the dielectric layer 200 corresponding to the first trench 210. A larger contact area corresponds to higher adhesion force and higher stability. If the depth of the second trench 220 is too large, it will cause the first conductive layer 110 in the substrate 100 to be exposed, which affects the device performance. Therefore, in the present embodiment, the ratio of the depth of the second trench 220 to the depth of the first trench 210 is between 0.5 and 0.8, so that the connection strength between the conductive material and the dielectric layer 200 is improved without affecting the device performance, and the reliability of the semiconductor structure is improved.

Figure 13:
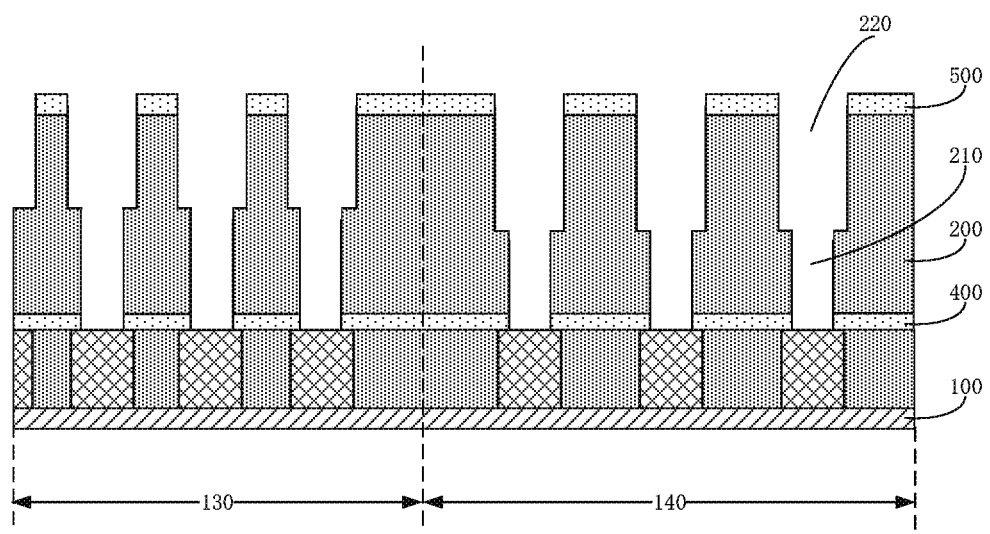
FIG. 13 schematically illustrates a cross section of a semiconductor structure including a first region and a second region of another embodiment.

In one embodiment, the substrate 100 includes a first region 130 and a second region 140. The first trench 210 and the second trench 220 are both located at the first region 130 and the second region 140, and a density of the first trench 210 at the first region 130 is greater than a density of the first trench 210 at the second region 140. Specifically, FIG. 13 is a cross-sectional diagram of a semiconductor structure that includes a first region 130 and a second region 140 of one embodiment. Referring to FIG. 13, in the present embodiment, the first region 130 is a region where elements and wires are distributed densely, and the second region 140 is a region where elements and wires are distributed loosely. It should be noted that the first region 130 and the second region 140 are only divided by a distribution density. In the present embodiment, the density of the first trench 210 in the first region 130 is greater than the density of the first trench 210 in the second region 140, so that the layout of device structures can be better matched, thereby obtaining relatively high integration of devices.

In one embodiment, the height ratio of the first filling layer 211 at the first region 130 is greater than the height ratio of the first filling layer 211 at the second region 140. Specifically, the first trench 210 at the first region 130 and the first trench 210 at the second region 140 are the same. The height of the first filling layer 211 at the first region 130 is adjusted to be greater than the height at the second region 140, so that the transverse etching rate of the second trench 220 at the first region 130 is less than the transverse etching rate of the second trench 220 at the second region 140 to ensure that the subsequently formed conductive material in the first region 130 cannot be short-circuited.

In one embodiment, the depth of the second trench 220 at the second region 140 is equal to the depth of the second trench 220 at the first region 130, so that the conductive material formed at the second region 140 and the conductive material formed at the first region 130 have the same electric properties, and the electric performance of a semiconductor device is improved. Preferably, the width of the second trench 220 at the second region 140 is equal to the width of the second trench 220 at the first region 130. The width is the size of the second trench 220 in the surface direction of the substrate 100.

Figure 14:
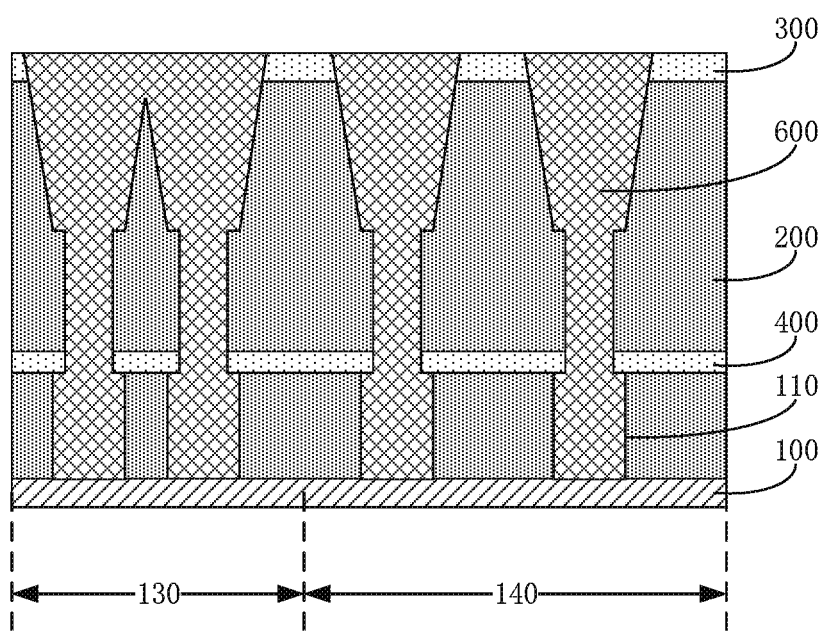
FIG. 14 schematically illustrates a cross section of a semiconductor structure of the existing technology.

In one embodiment, the depth of the second trench 220 at the second region 140 is greater than the depth of the second trench 220 at the first region 130. FIG. 14 is a cross-sectional diagram of a semiconductor structure of the existing technology. Referring to FIG. 14, it can be understood that the arrangement density of the structure is greater in the first region 130, so that the problem of transverse etching of the dielectric layer 200 easily occurs, and the short-circuit phenomenon of the second conductive layer 600 is further caused. Referring to FIG. 13, in the present embodiment, by means of setting the depth of the second trench 220 at the second region 140 to be greater than the depth of the second trench 220 at the first region 130, the connection strength of the conductive material of the second region 140 can be ensured, and the short-circuit phenomenon of the conductive material of the first region 130 is avoided, so that a semiconductor structure with higher performance is provided.

A semiconductor structure is formed by the above-mentioned method for forming a semiconductor structure. Referring to FIG. 9, the semiconductor structure includes a substrate 100, a dielectric layer 200 arranged on the substrate 100, and a second conductive layer 600 made from a conductive material and arranged in the first trench 210 and the second trench 220. The dielectric layer 200 has a first trench 210 and a second trench 220, and the second trench 220 exposes the first trench 210 in a perpendicular direction. In the above semiconductor structure, the second trench 220 which is wider than the first trench 210 is disposed, so that the first trench 210 and the second trench 220 are jointly used to deposit the conductive materials to form the second conductive layer 600 with better contact performance and structural reliability.

It should be understood that although the steps in the flowcharts of FIG. 1 and FIG. 10 are shown sequentially as indicated by the arrows, the steps are not necessarily performed sequentially as indicated by the arrows. Unless specifically stated otherwise herein, the steps are not performed in a strict order of limitation, and the steps may be performed in other orders. Moreover, at least part of the steps in FIG. 1 and FIG. 10 may include a plurality of substeps or phases that are not necessarily performed at the same time, but may be performed at different times. These substeps or phases are not necessarily performed in sequence, but rather may be performed in turn or alternation with other steps or other substeps or at least part of the substeps or phases in the other steps.

The technical features of the embodiments described above can be arbitrarily combined. In order to make the description concise, all possible combinations of various technical features in the above embodiments are not completely described. However, the combinations of these technical features should be considered as the scope described in the present specification as long as there is no contradiction in them.

The foregoing embodiments represent only a few implementation modes of the present application, and the descriptions are specific and detailed, but should not be construed as limiting the patent scope of the present application. It should be noted that those of ordinary skill in the art may further make variations and improvements without departing from the conception of the present application, and these variations and improvements all fall within the protection scope of the present application. Therefore, the patent protection scope of the present application should be subject to the appended claims.

The invention claimed is:

1. A method for forming a semiconductor structure, comprising:
    providing a substrate comprising a first region and a second region;
    forming a dielectric layer having a plurality of first trenches located at the first region and the second region on the substrate, wherein a distribution density of the first trenches at the first region is greater than a distribution density of the first trenches at the second region, and the first trenches at the first region and the first trenches at the second region have a same depth;
    forming a first filling layer for partially filling each of the first trenches, a height of the first filling layer at the first region is greater than a height of the first filling layer at the second region;
    forming a first mask layer having a first opening on the dielectric layer, the first opening exposing the first filling layer and part of the dielectric layer;
    etching the dielectric layer by taking the first mask layer as a mask to form a plurality of second trenches located at the first region and the second region;
    removing the first filling layer; and
    forming conductive materials in the first trenches and the second trenches.

2. The method for forming the semiconductor structure of claim 1, wherein the forming the first filling layer in each of the first trenches comprises:
    forming an initial first filling layer in each of the first trenches and on the dielectric layer; and
    etching back an entirety of the initial first filling layer on the dielectric layer and part of the initial first filling layer in the first trenches, a remaining part of the initial first filling layer being used as the first filling layer.

3. The method for forming the semiconductor structure of claim 2, wherein the etching back the entirety of the initial first filling layer on the dielectric layer and the part of the initial first filling layer in the first trenches, the remaining part of the initial first filling layer being used as the first filling layer comprises:

etching back the entirety of the initial first filling layer on the dielectric layer and the part of the initial first filling layer in the first trenches so that a height ratio of the first filling layer satisfies a preset range, the remaining part of the initial first filling layer being used as the first filling layer;

wherein the height ratio is a ratio of a height of the first filling layer in a direction perpendicular to the substrate to a depth of the first trenches.

4. The method for forming the semiconductor structure of claim 3, wherein the height ratio of the first filling layer is between 0.7 and 0.9.

5. The method for forming the semiconductor structure of claim 4, wherein a ratio of a depth of the second trenches to the depth of the first trenches is between 0.5 and 0.8.

6. The method for forming the semiconductor structure of claim 2, wherein an etch selection ratio of the dielectric layer and the first filling layer is greater than 7.

7. The method for forming the semiconductor structure of claim 1, wherein a depth of the second trenches at the second region is greater than a depth of the second trenches at the first region.

8. The method for forming the semiconductor structure of claim 1, wherein the forming the first mask layer having the first opening on the dielectric layer, the first opening exposing the first filling layer and the part of the dielectric layer comprises:

forming the first filling layer in each of the first trenches and on the dielectric layer; and removing an entirety of the first mask layer in the first trenches and part of the first mask layer on the dielectric layer.

9. The method for forming the semiconductor structure of claim 8, wherein the first mask layer is a photoresist layer.

10. The method for forming the semiconductor structure of claim 1, wherein the etching the dielectric layer by taking the first mask layer as the mask to form the second trenches located at the first region and the second regions comprises:

etching the dielectric layer by taking the first mask layer as the mask to form the second trenches located at the first region and the second region, wherein a depth of the second trenches is less than a depth of the first trenches, and a bottom of the second trenches is lower than a top of the first filling layer.

11. The method for forming the semiconductor structure of claim 1, wherein a depth of the second trenches at the second region is equal to a depth of the second trenches at the first region.

12. A semiconductor structure, formed by the method for forming the semiconductor structure of claim 1.

\* \* \* \* \*